(12) United States Patent
Von Elm

(10) Patent No.: US 9,031,114 B1
(45) Date of Patent: May 12, 2015

(54) VIBRATION RESISTANT OPTICALLY PUMPED SEMICONDUCTOR LASER

(71) Applicant: Coherent LaserSystems GmbH & Co. KG, Göttingen (DE)

(72) Inventor: Rüdiger Von Elm, Wielen (DE)

(73) Assignee: Coherent LaserSystems GmbH & Co. KG, Göttingen (DE)

( * ) Notice: Subject to any disclaimer, the term of this patent is extended or adjusted under 35 U.S.C. 154(b) by 0 days.

(21) Appl. No.: 14/210,433

(22) Filed: Mar. 13, 2014

(51) Int. Cl.
*H01S 3/081* (2006.01)
*H01S 5/022* (2006.01)
*H01S 5/04* (2006.01)
*H01S 5/06* (2006.01)

(52) U.S. Cl.
CPC ............. *H01S 5/02252* (2013.01); *H01S 5/041* (2013.01); *H01S 5/0604* (2013.01)

(58) Field of Classification Search
CPC .... H01S 5/041; H01S 5/0604; H01S 5/02252
USPC ............................................ 372/22; 248/550
See application file for complete search history.

(56) References Cited

U.S. PATENT DOCUMENTS

| | | | |
|---|---|---|---|
| 6,097,742 A | 8/2000 | Caprara et al. | |
| 6,198,756 B1 | 3/2001 | Caprara et al. | |
| 6,940,880 B2 | 9/2005 | Butterworth et al. | |
| 7,466,728 B2 | 12/2008 | Clubley et al. | |
| 7,583,711 B2 | 9/2009 | Tiemann | |
| 2012/0158191 A1* | 6/2012 | Rijnveld et al. | 700/280 |
| 2012/0281723 A1* | 11/2012 | Oh et al. | 372/20 |

* cited by examiner

*Primary Examiner* — Tuan Nguyen
(74) *Attorney, Agent, or Firm* — Morrison & Foerster LLP

(57) ABSTRACT

An intra-cavity frequency doubled OPS-laser includes a laser-resonator terminated by a plane mirror and a mirror-structure of an OPS-chip. The resonator is folded by three fold-mirrors. The fold-mirrors are supported on a vibration-isolation plate supported by isolation posts above a base-plate. The plane mirror and the mirror-structure of the OPS-chip are mounted back to back on opposite parallel surfaces of a mounting block. The mounting-block is supported on the base-plate and extends through an aperture in the vibration-isolation plate. Movement of the vibration-isolation plate with respect to the base-plate does not change the resonator length.

20 Claims, 2 Drawing Sheets

VIBRATION RESISTANT OPTICALLY PUMPED SEMICONDUCTOR LASER

TECHNICAL FIELD OF THE INVENTION

The present invention relates in general to optically pumped semiconductor (OPS) lasers. The invention relates in particular to intra-cavity frequency converted OPS lasers.

DISCUSSION OF BACKGROUND ART

Intra-cavity frequency converted (frequency doubled) OPS-lasers can provide several Watts (W) of continuous wave (CW) radiation output at visible (green) wavelengths while operating in a single longitudinal mode. The green, single-mode output wavelength can be converted to a wavelength in the ultraviolet (UV) region of the electromagnetic spectrum by further frequency multiplication in an optically non-linear crystal outside the OPS laser cavity (laser-resonator).

By way of example, an OPS-laser having a fundamental lasing wavelength of about 1064 nanometers (nm) can be frequency-doubled by an intra-cavity optically nonlinear crystal to provide output radiation having a wavelength of about 532 nm. That output radiation can be converted to UV radiation having a wavelength of about 266 nm by frequency-doubling the output radiation in an optically nonlinear crystal located outside the OPS laser-resonator.

The doubling of the doubled OPS-laser output radiation t0 266 nm is preferably realized by locating the extra-cavity optically nonlinear crystal in a passive ring-resonator resonant at the doubled frequency (532 nm wavelength). This increases the "green" radiation intensity in the optically non-linear crystal thereby increasing the conversion efficiency of the crystal. Such a resonator typically has a length which is actively (automatically) controlled by selectively moving one mirror of the ring-resonator while detecting the resonant condition of the ring-resonator thereby maintain the ring resonator in a resonant condition for the OPS-laser output radiation. The resonance-detection method can be a polarization-based method, such as the Hansch-Couillaud method, or frequency-modulation based method such as the Pound-Drever method.

While the OPS-laser output radiation is single longitudinal mode (single frequency) operation environmental factors such temperature change and vibration can cause the single-mode to "hop" from one resonator mode to another. Whenever such a "mode-hop" occurs, the length control mechanism for the ring resonator must accommodate the new single frequency of the OPS-laser output radiation. Even if no mode-hopping occurs, changes in resonator length will cause slight continuous changes in wavelength.

In the case of mode-hopping due to vibration, the mode-hopping can occur at a rate that is comparable to or greater than the response-time of the length-control arrangement for the ring-resonator. This would lead to a generally lower conversion efficiency and noise in the UV radiation generated in the ring resonator. There is a need for an OPS-resonator that is resistant to vibration-induced mode-hopping.

SUMMARY OF THE INVENTION

In one aspect, apparatus in accordance with the present invention comprises a baseplate a vibration-isolation plate supported on the baseplate via a plurality of vibration isolation members, and a folded laser-resonator terminated by first and second end-mirrors, and folded by a plurality of fold-mirrors. The end-mirrors are supported on the baseplate in a fixed relationship to each other. The fold-mirrors are mounted on the vibration-isolation plate in a fixed relationship with each other.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1A:
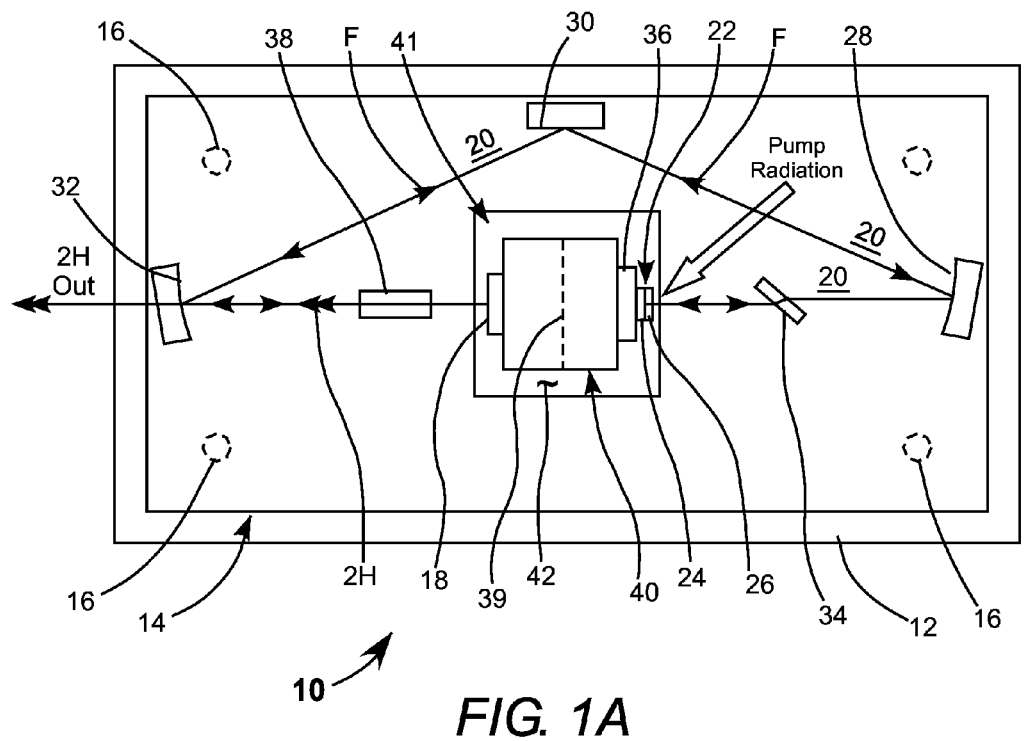
FIG. 1A is a plan view from above schematically illustrating a preferred embodiment of a vibration resistant, intra-cavity frequency doubled OPS-laser in accordance with the present invention, including a laser-resonator terminated by a plane mirror and a mirror structure of an OPS-chip and folded by three fold-mirrors, the fold-mirrors being mounted on a vibration isolation plate supported by isolation posts above a base plate, and the plane mirror and the mirror structure of the OPS-chip mounted back to back on opposite parallel surfaces of a mounting block supported on the base plate and extending through an aperture in the vibration isolation plate.
Figure 1B:
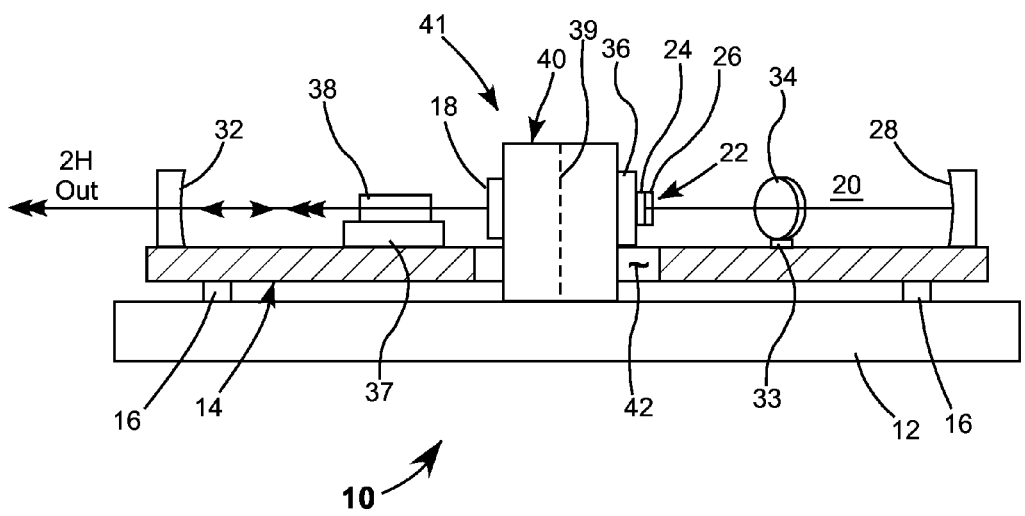
FIG. 1B is an elevation view partly in cross section schematically illustrating further details on the OPS-laser of FIG. 1A.

Referring now to the drawings, wherein like components are designated by like reference numerals, FIG. 1A and FIG. 1B schematically illustrate a preferred embodiment 10 of a vibration resistant, intra-cavity frequency doubled OPS-laser in accordance with the present invention. The laser is assembled on a baseplate 12. A vibration-isolation plate 14 is supported on baseplate 12 by resilient posts 16 here arranged at corners of an imaginary rectangle. Vibration-isolation plate 14 is shown in cross-section in FIG. 1B. Those skilled in the mechanical engineering art may devise other resilient-post arrangements without departing from the spirit and scope of the present invention.

Laser 10 has a laser-resonator 20 terminated by a mirror structure 24 of an OPS-structure (chip) 22 and an end-mirror 18. Resonator 20 includes fold-mirrors 28 and 32 axially (normally) facing mirror-structure 24 and end-mirror 18, respectively. The laser-resonator is completed here by an additional fold-mirror 30. Optical gain is provided by a multilayer semiconductor gain-structure 26 surmounting mirror-structure 24 of OPS-chip 22.

Optical pump-radiation directed into gain-structure 26 provides that fundamental-wavelength radiation circulates in the laser-resonator as indicated by single arrowheads F. The fundamental wavelength is selected by a birefringent filter 34 from the gain-bandwidth of gain-structure 26. Mirror-structure 24 and mirrors 28, 30 and 32 are all maximally reflective for the fundamental-wavelength radiation.

The circulating fundamental-wavelength radiation is converted into second-harmonic (2H) radiation by a frequency-doubling in forward and reverse transmission through an optically nonlinear crystal 38, here, located between mirror 32 and mirror 18. The 2H-radiation is indicated in FIGS. 1A and 1B by double arrow heads 2H. Mirror 18 is additionally maximally reflective for the 2H-radiation. Mirror 32 is additionally maximally transmissive for the 2H-radiation. This allows the 2H-radiation to be delivered from the resonator as output radiation. Mounting of the birefringent filter and the optically nonlinear crystal on vibration-isolation plate 14 is depicted by members 33 and 37, respectively, for simplicity of illustration. Those skilled in the art will recognize that such mounting would usually include a temperature control arrangement for each, such as a thermo-electric (TE) element or the like.

It should be noted here that only sufficient description of the optical arrangement of OPS-laser 10 is provided for understanding principles of the present invention. A detailed description of fundamental and frequency-converted OPS-lasers is provided in U.S. Pat. No. 6,097,742 assigned to the assignee of the present invention, and the complete disclosure of which is hereby incorporated herein by reference.

Continuing with reference to FIGS. 1A and 1B, vibration resistant aspects of the inventive OPS-laser are next described. Part of this vibration resistance is the mounting of all resonator components, except for OPS-chip 22 and end-mirror 18, on vibration-isolation plate 14. It is not practical to mount OPS-chip 24 on plate 14 because the OPS-chip must be cooled to prevent premature thermal rollover. Because of this, chip 24 is mounted on a thermally conductive sub-mount 36, which is attached, in turn, to a thermally conductive mounting block 40. Mounting block 40 extends through an aperture 42 in vibration-isolation plate 14, and is attached to baseplate 12. This provides for thermal-communication between the OPS-chip and the baseplate.

Because OPS-chip 22 is attached (effectively) to base plate 12, i.e., effectively mounted on baseplate 12, end-mirror 18 must also be mounted on baseplate 12. This is effected in laser 10 by mounting end-mirror 18 on block 40 in a back-to-back relationship with (mirror-structure 24 of) OPS-chip 22. It is not necessary that block 40 is a single member, the block could be two separate members, spaced apart or contiguous as indicated in phantom by dashed line 29. A reason for this (fixed-relationship), back-to-back mounting of the OPS-chip and end-mirror 18 on the baseplate is set forth below with reference to FIG. 2.

Here, a situation is depicted wherein vibration has caused vibration-isolation plate 14 to be displaced in shear, relative to baseplate 12, in a direction parallel to the propagation path of radiation incident one end-mirror 18 and OPS-chip 22. The shear displacement is a distance Δz. It can be seen, as a result that the original position of mirror 18 has been displaced to a position closer to fold-mirror 32, thereby changing the optical path from mirror 32 to mirror 18 by an amount −Δz. The original position of mirror-structure 24 of OPS structure 22 has been displaced to a position further from mirror 28, thereby changing the optical path from mirror 28 to mirror-structure 24 by an amount +Δz. The optical path-length from mirrors 28 and 32 to mirror 30 is unchanged by the displacement. This provides that the optical path length of resonator 20, and, accordingly, the fundamental-wavelength is unchanged by the displacement.

Shear-modes of vibration displacement between vibration-isolation plate 14 and baseplate 12 are expected to be the most prevalent. The isolation-post arrangement is expected to be resistant to roll, pitch, and yaw modes of displacement. In any event these modes, alone, would not change the resonator length but merely the resonator alignment.

Figure 2:
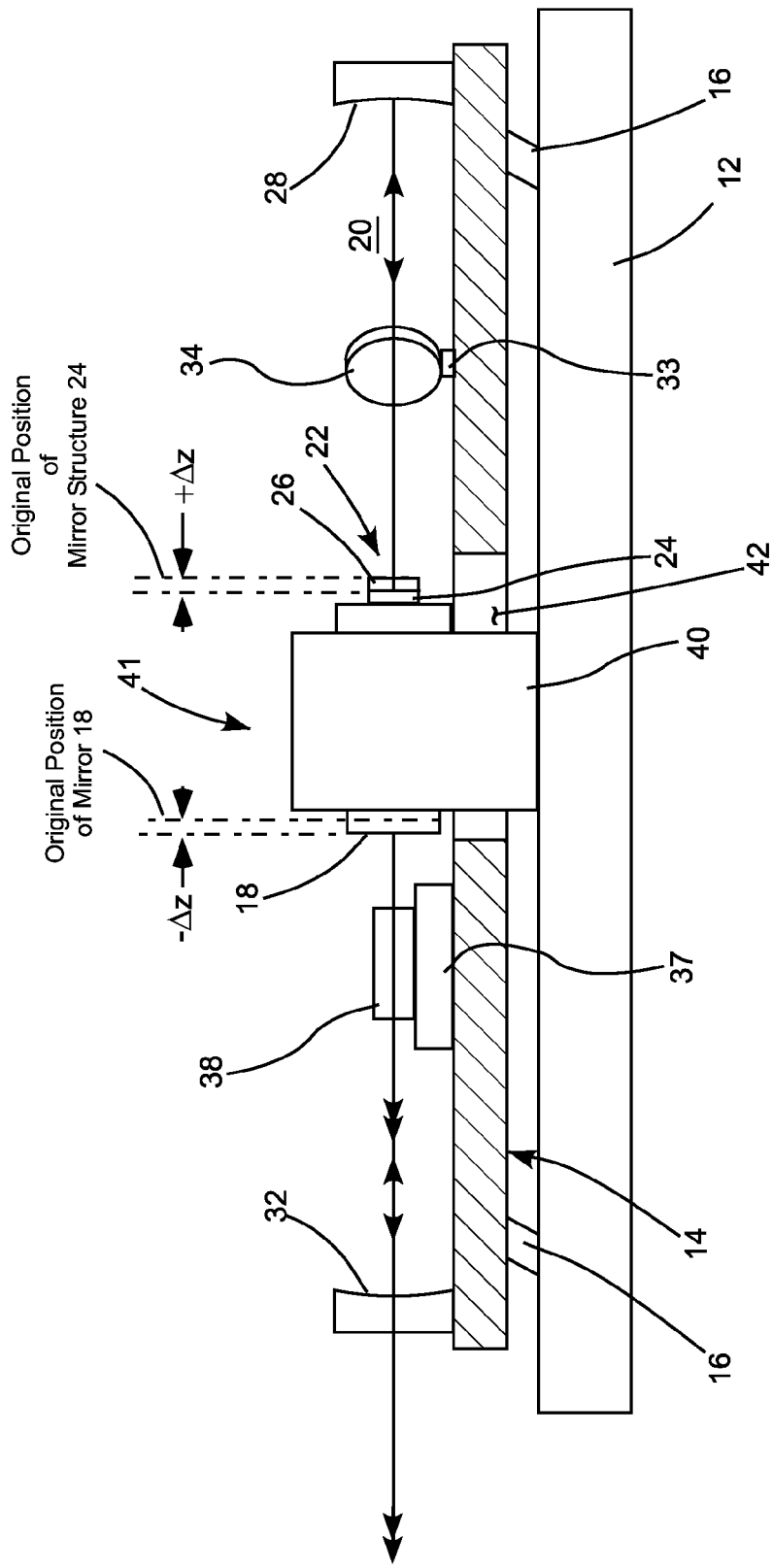
FIG. 2 is an elevation view of the OPS-laser of FIGS. 1A and 1B with the isolation plate vibration-displaced in shear with respect to the base plate with axial displacement of the plane mirror toward one of the resonator fold-mirrors offset by an equal axial displacement of the OPS-chip away from another of the fold-mirrors to maintain the laser-resonator length constant.

For a shear-displacement of vibration-isolation plate 14 with respect to baseplate 12 in a direction perpendicular to the direction of FIG. 2, i.e., in a direction perpendicular to the plane of the drawing, the optical path length between any two mirrors of laser-resonator 20 remains the same. Absent any measure to the contrary, however, there may be some displacement between the lasing-mode on the OPS-chip and the pump-radiation on the OPS-chip. This would have no effect on the resonator length but could cause noise due to power (gain) fluctuations.

One way to prevent this is to deliver pump-radiation from a source thereof via an optical fiber, with the delivery-end of the fiber, and any optics for focusing the radiation on the OPS-chip, fixedly mounted on vibration-isolation plate 14. Another way to prevent this without such fixation is to deliver the pump radiation in a flat-topped beam having a diameter larger than the laser-mode diameter by an amount sufficient to accommodate the displacement. This, of course, would be wasteful of pump-power and could complicate cooling of the OPS-chip.

Those skilled in the art will recognize from the description presented above that it is not necessary that the incidence paths of radiation on end-mirror 18 and OPS-chip are parallel to each other. Of course, these paths, individually, must be normal to the end-mirror and the OPS-chip. What is necessary is that OPS-chip and the end-mirror must be mounted on individual or a common mounts fixedly attached to the baseplate, so that they are always in a fixed relationship with each other.

In summary, the present invention is described above with reference to a preferred and other embodiments. The invention is not limited, however, to the embodiments described and depicted herein. Rather, the invention is limited only by the claims appended hereto.

What is claimed is:

1. Optical apparatus, comprising: a baseplate; a vibration-isolation plate supported on the baseplate via a plurality of isolation members; and a folded laser-resonator terminated by first and second end-mirrors and folded by a plurality of fold-mirrors, with the end-mirrors supported on the baseplate in a fixed relationship to each other, and the fold-mirrors supported on the vibration-isolation plate in a fixed relationship with each other; wherein there are three fold-mirrors in the plurality thereof; and further including a gain-element located in the laser-resonator and a source of pump-radiation arranged to excite the gain-medium, thereby causing laser-radiation having a fundamental frequency to circulate in the laser-resonator.

2. The apparatus of claim 1, wherein the laser-resonator includes an OPS-chip having a mirror-structure surmounted by a gain-structure and the first end-mirror is the mirror-structure of the OPS-chip.

3. The apparatus of claim 1 wherein the first and second end-mirrors are mounted on opposite sides of a mounting block attached to the baseplate.

4. The apparatus of claim 3, wherein the vibration isolation plate has an aperture therein and the mounting block extends through the aperture in the baseplate.

5. The apparatus of claim 3 wherein the mounting block has first and second opposite parallel faces and the first and second end-mirrors are mounted respectively on the first and second opposite parallel faces of the mounting block.

6. The apparatus of claim 1 further including an optically nonlinear crystal located in the laser-resonator and arranged for doubling the frequency of the circulating laser-radiation.

7. Optical apparatus, comprising:
a baseplate;
a vibration-isolation plate supported on the baseplate via a plurality of isolation members;

a folded laser-resonator terminated by first and second end-mirrors and folded by a plurality of fold-mirrors, with the end-mirrors supported on the baseplate in a fixed relationship to each other, and the fold-mirrors supported on the vibration-isolation plate in a fixed relationship with each other;

a gain-element located in the laser-resonator and a source of pump-radiation arranged to excite the gain-medium, thereby causing laser-radiation having a fundamental frequency to circulate in the laser-resonator;

an optically nonlinear crystal located in the laser-resonator and arranged for doubling the frequency of the circulating laser-radiation; and wherein one of the plurality of fold-mirrors is transmissive for the frequency-doubled laser-radiation, whereby the frequency-doubled laser-radiation is delivered from the laser-resonator via that one fold-mirror as output radiation.

8. The apparatus of claim 7, wherein the laser-resonator includes an OPS-chip having a mirror-structure surmounted by a gain-structure, and the first end-mirror is the mirror-structure of the OPS-chip and the gain-structure is the gain-element.

9. The apparatus of claim 8 wherein the OPS-chip and the second end-mirrors are mounted on opposite sides of a mounting block attached to the baseplate.

10. The apparatus of claim 9, wherein the vibration isolation plate has an aperture therein and the mounting block extends through the aperture in the baseplate.

11. The apparatus of claim 10 wherein the mounting block has first and second opposite parallel faces and the first and second end-mirrors are mounted respectively on the first and second opposite parallel faces of the mounting block.

12. The apparatus of claim 11, wherein there are three fold-mirrors in the plurality thereof.

13. The apparatus of claim 11 further including an optically nonlinear crystal located in the laser-resonator and arranged for doubling the frequency of the circulating laser-radiation.

14. Optical apparatus, comprising:
a baseplate;
a vibration-isolation plate supported on the baseplate via a plurality of isolation members;
an OPS-chip including a mirror-structure surmounted by a gain-structure;
a folded laser-resonator terminated by and end-mirror and the mirror-structure of the OPS-chip and folded by a plurality of fold-mirrors, with the end-mirror and the OPS-chip supported on the baseplate in a fixed relationship to each other, and the fold-mirrors supported on the vibration-isolation plate in a fixed relationship with each other;
a source of pump-radiation arranged to excite the gain-structure of the OPS-chip, thereby causing laser-radiation having a fundamental frequency to circulate in the laser-resonator;
an optically nonlinear crystal located in the laser-resonator and arranged for doubling the frequency of the circulating laser-radiation; and
wherein one of the plurality of fold-mirrors is transmissive for the frequency-doubled laser-radiation, whereby the frequency-doubled laser-radiation is delivered from the laser-resonator via that one fold-mirror as output radiation.

15. The apparatus of claim 14 wherein the end-mirror and the OPS-chip are mounted on opposite sides of a mounting block attached to the baseplate.

16. The apparatus of claim 15, wherein the vibration isolation plate has an aperture therein and the mounting block extends through the aperture in the baseplate.

17. The apparatus of claim 16 wherein the mounting block has first and second opposite parallel faces and the end-mirror and the OPS-chip are mounted respectively on the first and second opposite parallel faces of the mounting block.

18. The apparatus of claim 14, wherein there are three fold-mirrors in the plurality thereof.

19. Optical apparatus, comprising: a baseplate; a vibration-isolation plate supported over the baseplate via a plurality of isolation members, said vibration isolation plate including an aperture; a mounting block connected to the baseplate and projecting up through the aperture in the base plate; a laser resonator terminated by first and second end mirrors mounted to opposite sides of the mounting block in a position above the vibration-isolation plate, said resonator further including a plurality of fold mirrors mounted on the vibration plate and in alignment with the first and second mirrors; and a gain medium located within the resonator.

20. The apparatus of claim 19 wherein said gain medium is mounted to one of the first and second end mirrors.

* * * * *